(12) United States Patent
Beer

(10) Patent No.: US 8,318,540 B2
(45) Date of Patent: Nov. 27, 2012

(54) METHOD OF MANUFACTURING A SEMICONDUCTOR STRUCTURE

(75) Inventor: Gottfried Beer, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 359 days.

(21) Appl. No.: 12/122,926

(22) Filed: May 19, 2008

(65) Prior Publication Data

US 2009/0286357 A1 Nov. 19, 2009

(51) Int. Cl.
*H01L 21/00* (2006.01)
(52) U.S. Cl. ......... 438/113; 257/E21.249; 257/E21.506; 257/E21.746
(58) Field of Classification Search .............. 438/113; 257/E21.249, E21.506, E21.476
See application file for complete search history.

(56) References Cited

U.S. PATENT DOCUMENTS

| | | | |
|---|---|---|---|
| 5,889,084 A | 3/1999 | Roth | |
| 6,472,239 B2 | 10/2002 | Hembree et al. | |
| 7,154,046 B2 | 12/2006 | Chung | |
| 7,196,408 B2 | 3/2007 | Yang et al. | |
| 7,566,010 B2 * | 7/2009 | Yamazaki et al. | 235/492 |
| 2001/0045530 A1 * | 11/2001 | Haeberle et al. | 250/548 |
| 2003/0010807 A1 | 1/2003 | Matthies et al. | |
| 2003/0157762 A1 * | 8/2003 | Peterson | 438/200 |
| 2004/0137660 A1 | 7/2004 | Murata | |
| 2005/0085009 A1 * | 4/2005 | Yamaguchi et al. | 438/106 |
| 2006/0006521 A1 * | 1/2006 | Boon et al. | 257/701 |
| 2006/0009574 A1 * | 1/2006 | Aert et al. | 524/832 |
| 2006/0128076 A1 * | 6/2006 | Li et al. | 438/149 |
| 2006/0197220 A1 | 9/2006 | Beer | |
| 2007/0020883 A1 * | 1/2007 | Arias et al. | 438/455 |
| 2007/0026567 A1 * | 2/2007 | Beer et al. | 438/106 |
| 2007/0181992 A1 * | 8/2007 | Lake | 257/698 |
| 2008/0060838 A1 | 3/2008 | Chen et al. | |
| 2008/0128268 A1 * | 6/2008 | Lopatin et al. | 204/192.1 |
| 2008/0179594 A1 * | 7/2008 | Oh | 257/59 |
| 2009/0239331 A1 * | 9/2009 | Xu et al. | 438/98 |

FOREIGN PATENT DOCUMENTS

| | | |
|---|---|---|
| DE | 10324615 A1 | 9/2004 |
| DE | 102005038956 B3 | 3/2007 |
| DE | 102006032730 A1 | 3/2007 |
| DE | 102006025162 B3 | 1/2008 |
| DE | 102006030581 B3 | 2/2008 |
| JP | 2001319950 A | 11/2001 |

OTHER PUBLICATIONS

"Etch and Plating Resist Formation by Hot Melt Ink Jet," SunChemical, Nigel Cagier, Sep. 2007, (16 pages).
D. Hayes et al., "MicroJet Printing of Solder and Polymers for Multi-Chip Modules and Chip-Scale Packages", Proceedings IMPAS 1999, pp. 1-8.

* cited by examiner

*Primary Examiner* — Shaun Campbell
(74) *Attorney, Agent, or Firm* — Dicke, Billig & Czaja, PLLC

(57) ABSTRACT

A method of manufacturing a semiconductor structure. One embodiment produces a substrate having at least two semiconductor chips embedded in a molded body. A layer is applied over at least one main surface of the substrate by using a jet printing process.

6 Claims, 14 Drawing Sheets

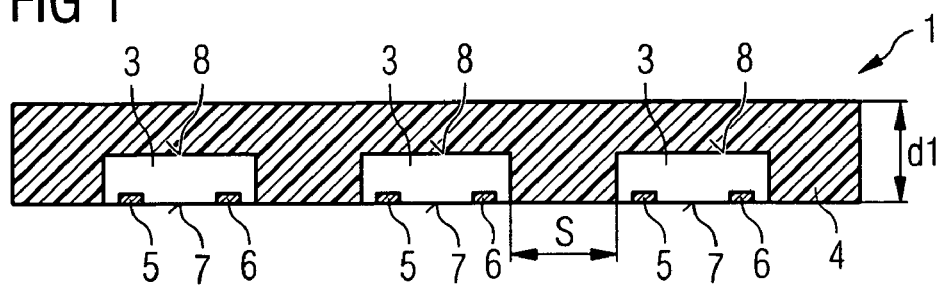
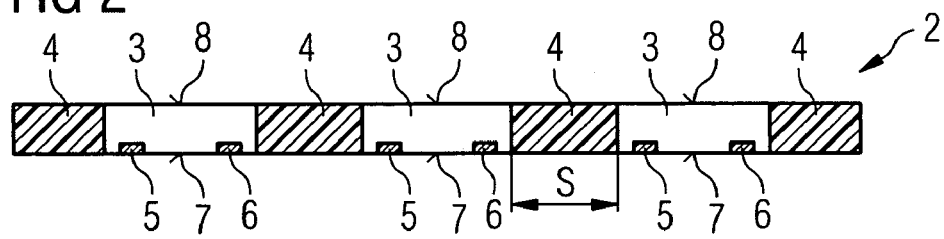
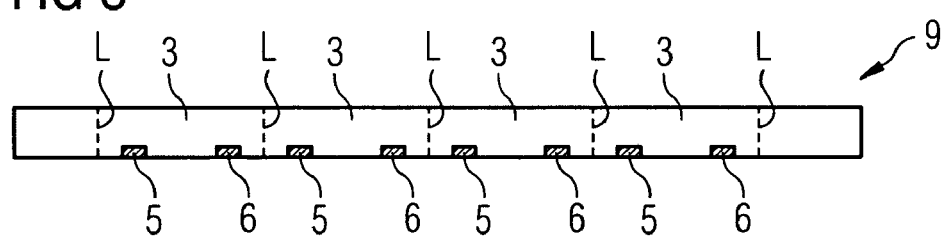
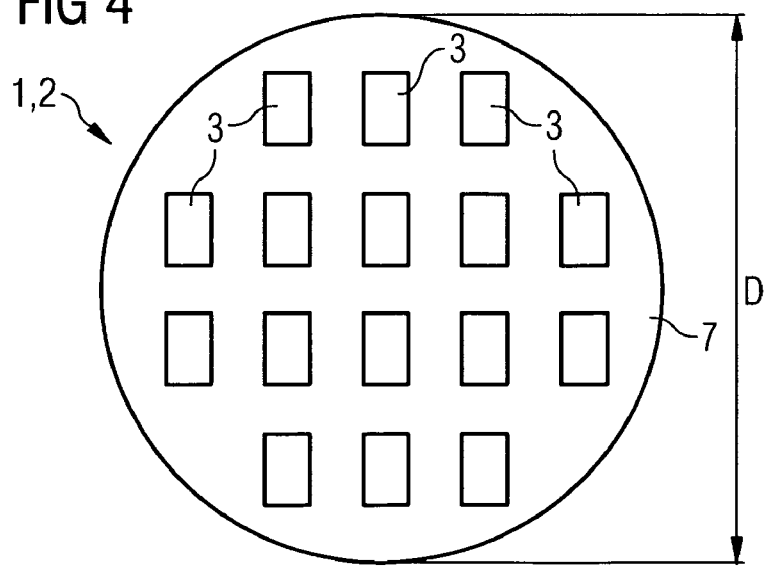

METHOD OF MANUFACTURING A SEMICONDUCTOR STRUCTURE

BACKGROUND

The invention relates to semiconductor structures and technologies applied to embedded semiconductor chip substrates, semiconductor wafers and semiconductor devices.

Recently, wafer level processes have become increasingly attractive for various reasons, amongst them their potential to provide for small package design of semiconductor devices and savings in manufacturing cost.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 is a schematic cross-sectional view of a first embedded semiconductor chip substrate.

FIG. 2 illustrates a schematic cross-sectional view of a second embedded semiconductor chip substrate.

FIG. 3 illustrates a schematic cross-sectional view of a semiconductor wafer.

FIG. 4 illustrates a top view of the structure illustrated in FIG. 2.

DETAILED DESCRIPTION

Figure 5:
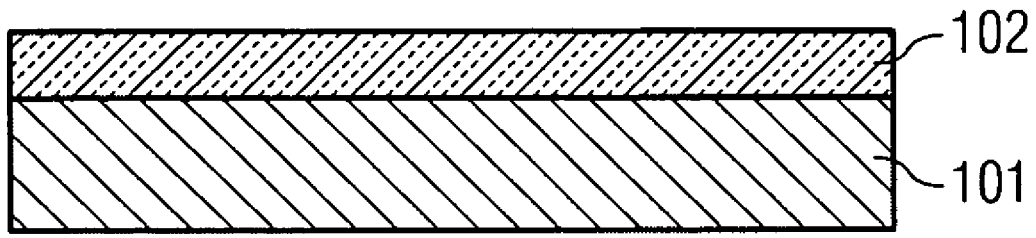
FIGS. 5-7 are schematic illustrations of fabrication processes of producing a semiconductor structure according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Methods of producing a semiconductor structure are described below. The semiconductor structure may be of different types and may include for example an embedded semiconductor chip substrate, a wafer including a plurality of integrated circuits or a single semiconductor chip.

If the semiconductor structure includes an embedded semiconductor chip substrate, a plurality of semiconductor chips are embedded in a molded body. The molded body is made of an electrically insulating molding material such as a resin, e.g., an epoxy-based material, a photoresist etc. The term "electrically insulating" refers to the property of the electrically insulating material to be at most only marginally electrically conductive relatively to electrically conductive components of the module. The molding material may be of any appropriate thermoplastic or thermosetting material. Various techniques may be employed to embed the semiconductor chips into the molding material, for example compression molding, injection molding, lamination or dispensing. After curing, the molded body made of the molding material provides a rigid structure accommodating a plurality (e.g., typically more than 50) semiconductor chips. The molded body may have a shape of a circular or polygonal disc or plate which may have a lateral dimension of more than 0.2 or even 0.3 m. Such molded bodies accommodating a plurality of spaced-apart redistributed semiconductor chips are often referred to as "molded reconstituted wafers".

Semiconductor chips or integrated circuits may, for example, be configured as logic circuits, control circuits, microprocessors or microelectro-mechanical components. They may also be power semiconductor devices such as power transistors, power diodes, IGBTs (Insulated Gate Bipolar Transistors), etc. In one embodiment, semiconductor chips having a vertical structure may be involved, that is to say semiconductor chips in which the electric currents can flow in a direction perpendicular to the main surfaces of the semiconductor chips. Semiconductor chips having a vertical structure may have contact elements in one embodiment on its two main surfaces, that is to say on its top side and bottom side.

One or more embodiments described herein use a jet printing process to apply a patterned layer to the semiconductor substrate. According to one embodiment, a patterned etch resist layer is applied by a jet printing process. In this case, the patterned etch resist layer is used as a mask to structure a layer to be structured.

The layer to be structured may be made of extremely different materials. It may be made of an electrically conductive material. Such materials are often used to provide for an electrical interconnect or wiring of the semiconductor structure. More specifically, the electrically conductive layer may be used to make electrical contact with the semiconductor chip from outside of a packaged module and/or to make electrical connections among a plurality of semiconductor chips accommodated in a packaged module. The electrically conductive layer may be manufactured with any desired geometric shape and any desired material composition. The electrically conductive layer may, for example, be composed of linear conductor tracks, but may also be in the form of a layer covering an area. Any desired electrically conductive materials, such as metals, for example aluminum, gold or copper, metal alloys or organic conductors, may be used as the material. The electrically conductive layer needs not be homogenous or manufactured from just one material, that is to say various compositions and concentrations of materials contained in the electrically conductive layer are possible.

In one embodiment, the layer to be structured may be made of an insulating material such as a polymer material or an inorganic material, e.g., silicon oxide, silicon nitride, oxinitride, low-k dielectric material (i.e. a dielectric material with a smaller dielectric constant than silicon dioxide), high-k dielectric material (i.e. a dielectric material with a higher dielectric constant than silicon dioxide) and ferroelectric material. Insulating polymer materials may be used to provide for thin film insulating layers of an electrical interconnect or wiring of the semiconductor structure. Insulating inorganic materials may be used as hard passivation layers or dielectrics of capacitors embedded in the electrical interconnect or wiring of the semiconductor structure.

According to one embodiment, a patterned mask layer may be applied by a jet printing process to overlay a seed layer. Such printed mask can be used to selectively deposit a metal structure over the exposed part of the seed layer. That way, ink-jet printing can be employed for galvanic or electroless plating processes used on embedded semiconductor chip substrates.

According to one embodiment, a dielectric layer may be applied by a jet printing process over a structured layer which includes recessed and non recessed zones. By controlling the jet printing process, the dielectric layer may be designed to have varying thickness over the structured layer. In one embodiment, the jet printing process may be controlled such that recessed zones of the structured layer are filled up by the dielectric material, such that a semiconductor structure with a leveled surface can be provided.

Further, jet printing may be used to provide a semiconductor substrate with a patterned protective layer, wherein information encoded by the pattern is marked in the protective layer. The protective layer may be made of any ink material such as legend acrylic or legend epoxy. The pattern may include indicating information about the semiconductor substrate or integrated circuits accommodated in the semiconductor substrate.

Further, jet printing may be used to generate a patterned solder stop layer over an electric redistribution structure of the semiconductor structure. The patterned solder stop layer may be generated directly by jet printing or may be structured by using a mask layer applied by a jet printing process to overlay the solder stop layer to be structured.

Materials used in jet printing processes as mentioned above may include e.g., filled or unfilled polyimides, epoxy resins, acrylate resins, silicone resins or mixtures of these materials.

FIGS. 1 to 4 illustrate semiconductor substrates to be used in methods described herein. Substrates 1, 2 as illustrated in FIGS. 1, 2 and 4 include a molded body 4 made of plastics embedding semiconductor chips 3. Such substrates including a molded body 4 will also be referred to as embedded semiconductor chip substrates and are also known as reconstituted wafers. The semiconductor chips 3 are arranged in a spaced-apart relationship within the substrate 1, 2. The distance S between neighboring semiconductor chips 3 may be in the range between 0.25 mm and 10 mm. It is to be noted that in FIGS. 1 and 2 only a partial section of the molded body is illustrated, that is to say in practice, typically much more than three semiconductor chips 3 are accommodated in the molded body 4. Furthermore, the semiconductor chip 3 may represent also a multichip arrangement of different chips like processors and/or memory chips and/or chip stacks and/or power devices and/or passive devices and/or optical devices etc.

Semiconductor chips 3 may have contact pads 5, 6 on a first main chip surface 7. If the semiconductor chips 3 are power transistors, the contact pad 5 may be a source terminal and the contact pad 6 may be a gate terminal. In other cases, e.g., if the semiconductor chip 3 is a power diode, only one contact pad (e.g., the anode terminal) may be provided on the first main chip surface 7. If the semiconductor chip 3 is a logic integrated circuit, typically several contact pads 5, 6 are arranged on the first main chip surface 7. It is to be noted that the first main chip surface 7 typically forms the active surface of the semiconductor chip 3.

The molded body 4 is made of an electrically insulating molding material. The molding material may be an epoxy or another appropriate material used in semiconductor packaging technology. It may also be a photoresist such as SU8, which is epoxy-based. The molding material may be composed of any appropriate thermoplastic or thermosetting material. After curing, the molding material provides stability to the array of semiconductor chips 3. Various techniques may be employed to embed the semiconductor chips 3 within the molding material, for example compression molding, injection molding, lamination or dispensing.

By way of example, in a compression molding process the liquid molding material is dispensed over a carrier (not illustrated) on which the semiconductor chips 3 are mounted and which forms the bottom of a lower mold of a mold tool (not illustrated). Then, after dispensing the liquid molding material, an upper mold half is moved down and spreads out the liquid molding material until a cavity between the carrier forming the bottom of the lower mold half and the upper mold half is completely filled. This process may be accompanied by the application of heat and pressure. After curing, the molding material is rigid and forms the molded body 4. The larger the lateral size of the molded body 4 ("molded reconstituted wafer") and the number of embedded chips 3, the more cost efficient the process will typically be.

As may be seen from FIG. 1, in embedded semiconductor chip substrate 1 the semiconductor chips 3 are completely covered by molding material at their side faces and their second main surfaces 8. FIG. 2 illustrates an embedded semiconductor chip substrate 2 in which the second main chip surfaces 8 are exposed. This substrate 2 may be generated by thinning (e.g., grinding or lapping) the substrate 1. Thinning of the molded body 4 is continued until at least the second main surfaces 8 of the semiconductor chips 3 are exposed. Thinning may further be continued to also reduce the thickness of the semiconductor chips 3.

By way of example, the substrate 1 in FIG. 1 may have a thickness d1 of about a couple of hundred micrometers, e.g., more than 200 µm, 500 µm or even more than 1000 µ. Thickness d1 is greater than the thickness of the semiconductor chips 3. As semiconductor wafers are often fabricated with a thickness of about 500 µm or 1000 µm, and may be ground in frontend processes to be as small as about 200 µm or even less, the thickness of the semiconductor chips 3 may e.g., be in a range of about 200 µm to 1000 µm. In FIG. 2, after thinning, the thickness of the substrate 2 may correspond to the thickness of the semiconductor chips 3 or may be less. It is to be noted that thinning strongly facilitates the further processing of the substrate 2 in subsequent processes, because it removes warpage or bow from the substrate 1.

FIG. 4 illustrates a top view on the molded body 4 of substrate 2. The molded body 4 may e.g., be disc-shaped having a diameter D of e.g., 200 or 300 mm, or may have any other shape such as a polygonal shape and the same or other lateral dimensions. FIG. 4 also illustrates a transparent top view of substrate 1.

FIG. 3 illustrates another substrate 9, namely a semiconductor wafer. Substrate 9 is made of a homogeneous semiconductor material such as e.g., silicon, i.e. does not include zones made of plastics. A number of integrated circuits are formed in the substrate 9. After dicing at separation lines L, the semiconductor wafer is separated into single semiconductor chips 3.

Figure 6:
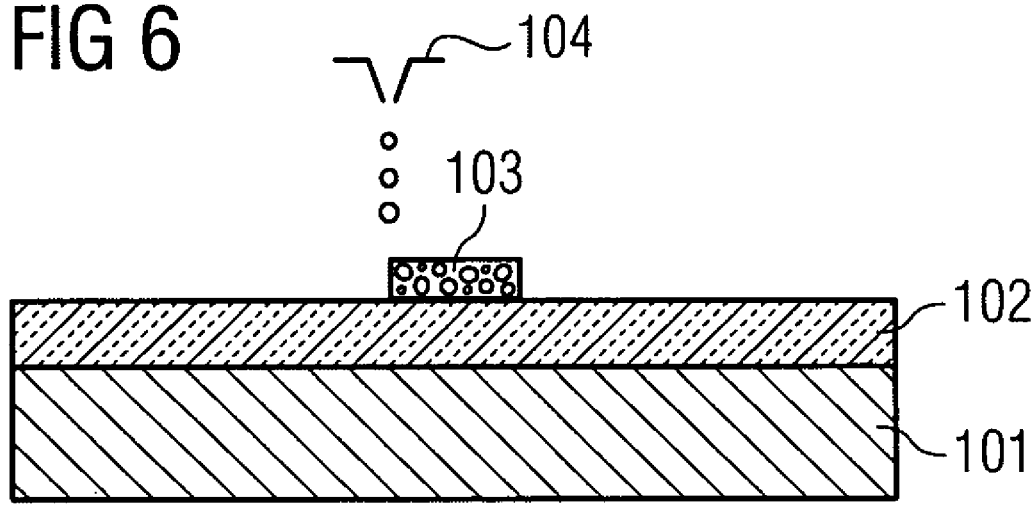
Figure 7:
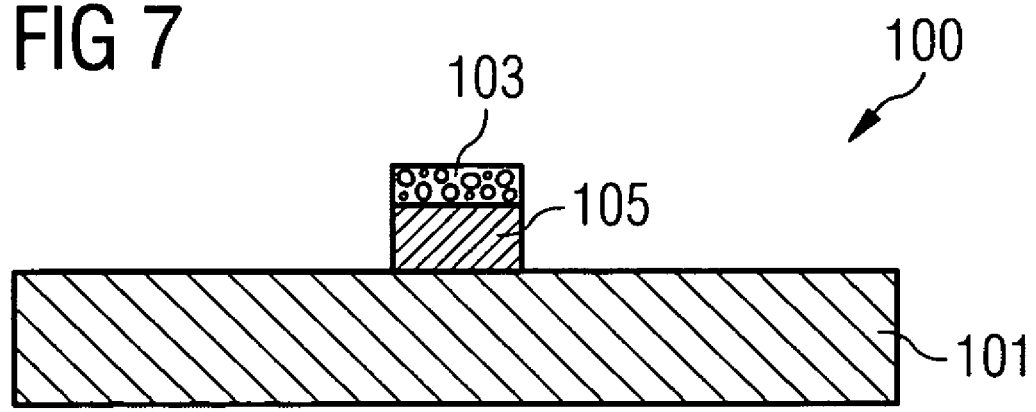

FIGS. 5 to 7 illustrate processes of a first fabrication process for producing a semiconductor structure 100. In a first process, an embedded semiconductor chip substrate 101 such as substrate 1 illustrated in FIG. 1 or substrate 2 illustrated in FIG. 2 is provided with a layer to be structured 102. The layer to be structured may be deposited e.g., by chemical vapor deposition (CVD), physical vapor deposition (PVD), spray coating or spin coating. In a second process, an etch resist 103 is deposited onto the layer to be structured 102. The etch resist 103 is deposited by an ink-jet printing method. To this end, an ink-jet printer of which the printing head (nozzle) 104 as illustrated in FIG. 6 is used to directly print or write the structure of the etch resist as a mask onto the layer to be structured 102. The etch resist ink may be of the type used for direct PCB (Printed Circuit Board) ink-jet resist printing. By way of example, a pigmented ink such as Epson's Durabrite Ink may be used.

The shape of the etch resist structure 103 implements a precise image or pattern of the structure to be generated from layer 102. The etching process is illustrated in FIG. 7. More specifically, the structure illustrated in FIG. 6 is subjected to an etchant. The etchant material depends on the material of the etch resist 103 and on the material of the layer to be structured 102. More specifically, whilst the etch resist 103 is resistant to the etchant, the layer to be structured 102 is removed by the etchant. By way of example, if the layer to be structured is a copper layer 102, etchants containing ammonium persulphate, sodium persulphate or pheric chlorite may be used. Etchants for other metals are also known in the art. If the layer to be structured 102 is an insulating layer such as an organic substance (polymer) or an inorganic passivation layer, appropriate etchants are equally available. As a result of the etching process, a structure 105 representing a precise image of the etch resist structure 103 is generated over the embedded semiconductor chip substrate 101.

It is to be noted that the structure 105 may be generated on either of the two main surfaces of the embedded semiconductor chip substrate 101. In most cases, the structure 105 will be generated on the surface of the embedded semiconductor chip substrate 101 at which the first main chip surfaces 7 are exposed. The structure 105 may represent conductor tracks or other conducting areas of an RDL (Redistribution Layer) applied to the embedded semiconductor chip substrate. In this case, the structure 105 is electrically connected to at least one of the contact pads 5, 6 of the semiconductor chips 3. Further, the structure 105 may represent another part of an RDL, e.g., a structured polymer layer. Such structured polymer layers may be used as insulating layers between multiple metal layers of an RDL. As another example, the structure 105 may be an inorganic dielectric used e.g., as a dielectric of a capacitor embedded within an RDL.

Figure 8:
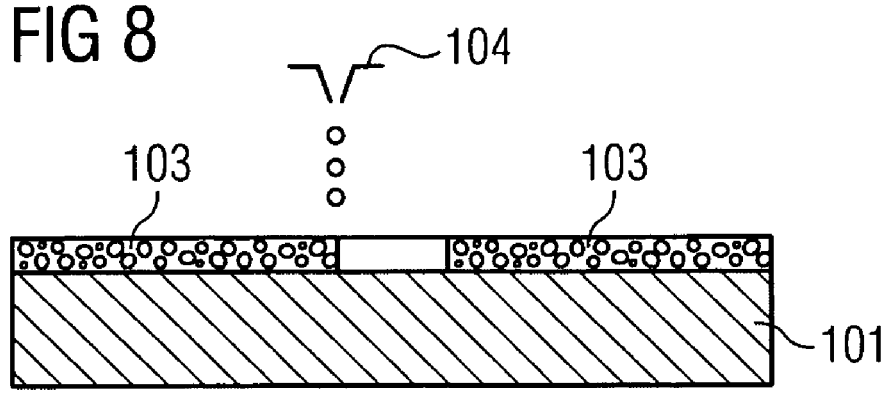
FIGS. 8, 9A, 9B, 10 are schematic illustrations of fabrication processes of producing a semiconductor structure according to one embodiment.

FIGS. 5 to 7 exemplify a subtractive structuring process. In one embodiment, an additive structuring process as illustrated in FIGS. 8 to 10 may be used to produce a semiconductor structure 200. In an additive process an etch resist or mask 103 is supplied to the zones over the embedded semiconductor chip substrate 101 which are not to be covered by the structure 105 to be generated. Again, the etch resist or mask 103 is directly structured by using an ink-jet printing process (FIG. 8). The same materials as mentioned above with respect to the subtractive process may be used.

Figure 9A:
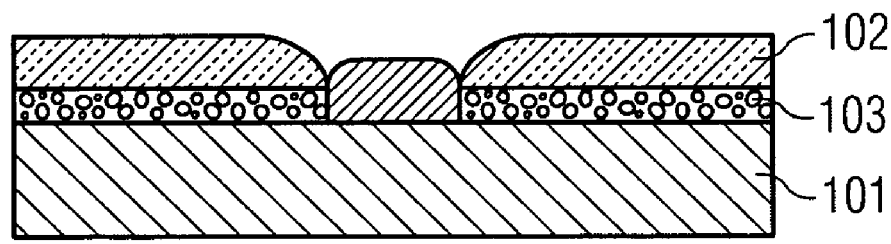
Figure 9B:
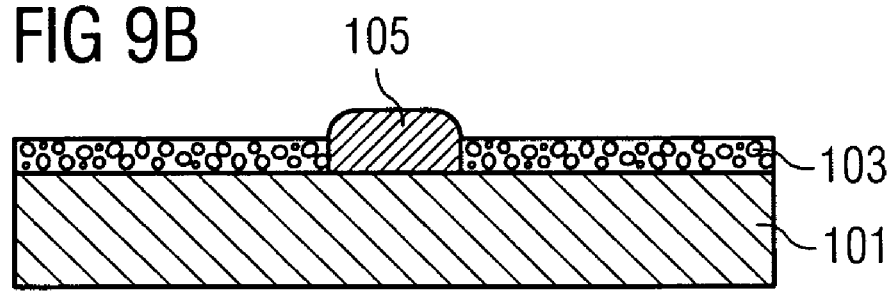
Figure 10:
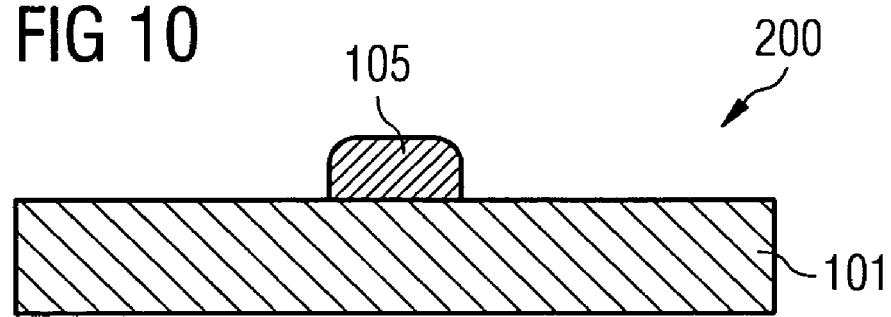

Referring to FIG. 9A, after application of an etch resist 103, the layer to be structured 102 is deposited on the etch resist 103. The layer to be structured 102 may cover the whole surface of the substrate 101, as illustrated in FIG. 9A. In one embodiment, as illustrated in FIG. 9B, a mask 103 may be applied and the structure 105 may selectively be deposited at the zones uncovered by the mask 103. By way of example, selective deposition of the structure 105 may be accomplished by a galvanic or electroless deposition process and will be described in more detail later.

After deposition of the layer to be structured 102 (FIG. 9A), the etch resist 103 is removed. The removal of the printed etch resist 103 results in a lift-off type structuring process, as the parts of the layer to be structured 102 lying above the etch resist 103 are stripped by removing the etch resist 103. On the other hand, considering the structure illustrated in FIG. 9B, the mask 103 may either be removed or remain on the substrate 101 because the selectively deposited structure 105 is already finished. If the mask 103 is removed, in both cases the structure illustrated in FIG. 10 is generated. Again, the embedded semiconductor chip substrate 101 may be of the type illustrated in FIGS. 1 or 2 and the structure 105 may be attached to either of the main surfaces 7 or 8 of the substrate 101 as explained in conjunction with FIGS. 5 to 7.

Figure 16:
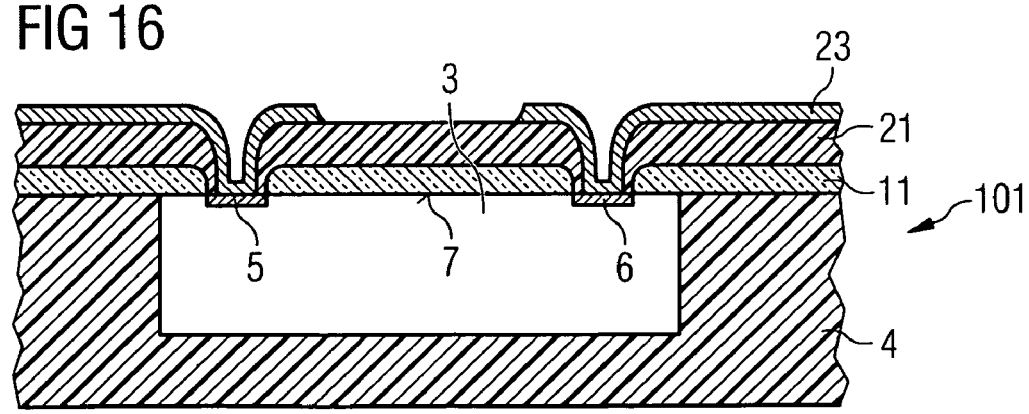
Figure 17:
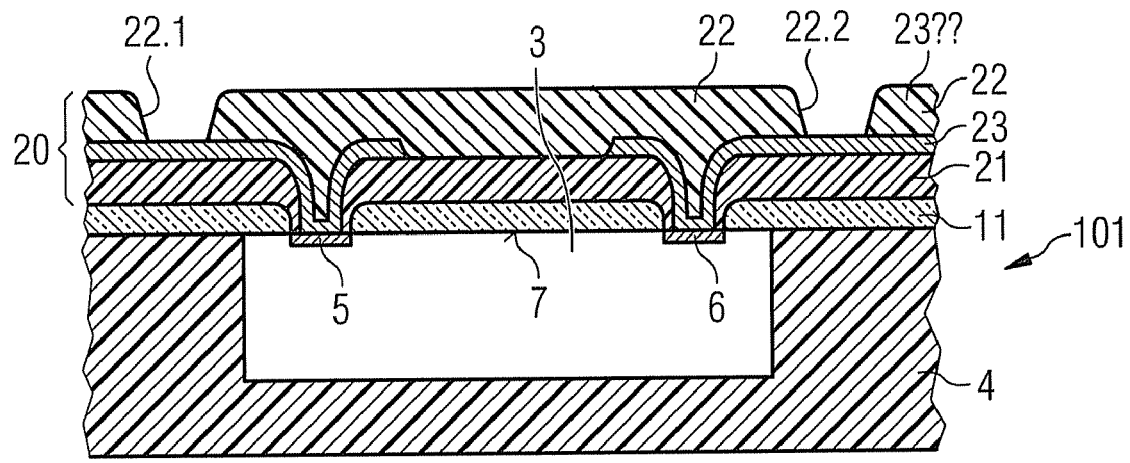
Figure 18:
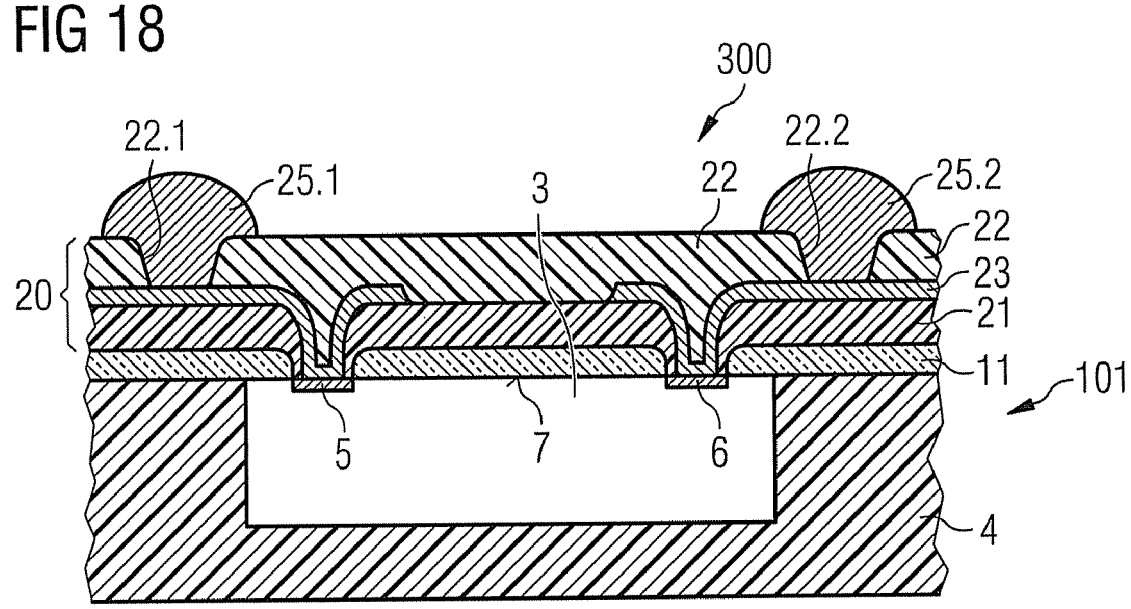

FIGS. 11 to 18 illustrate in more detail fabrication processes of producing a semiconductor structure 300. FIG. 18 illustrates a conductive redistribution structure 20 including a first polymer layer 21, a second polymer layer 22 and a metal layer 23 arranged between the first polymer layer 21 and the second polymer layer 22. The second polymer layer 22 includes openings 22.1, 22.2 through which a contact is made between external contact elements 25.1, 25.2 (e.g., solder balls) and the metal layer 23. The redistribution structure 20 is often referred to as RDL in the art.

The RDL 20 is applied over an embedded semiconductor chip substrate 101. Only a part including one semiconductor chip 3 of the embedded semiconductor chip substrate 101 is illustrated. As already mentioned, the embedded semiconductor chip substrate 101 may be of the type of substrate 1 illustrated in FIG. 1 or substrate 2 illustrated in FIG. 2.

The substrate 101 is coated with an insulating layer 11. The insulating layer may be a hard passivation layer made of an inorganic material such as silicon oxide, silicon nitride, oxinitride etc. Such hard passivation layer may be as thin as 200 nm or less. In one embodiment, the insulating layer 11 may be made of an organic polymer material. Such dielectric polymer layer may be a layer made of a photoresist may be deposited e.g., by chemical vapor deposition (CVD), physical vapor deposition (PVD), spray coating or spin coating. In this case, it may not be necessary to apply an inorganic hard passivation layer.

Figure 11:
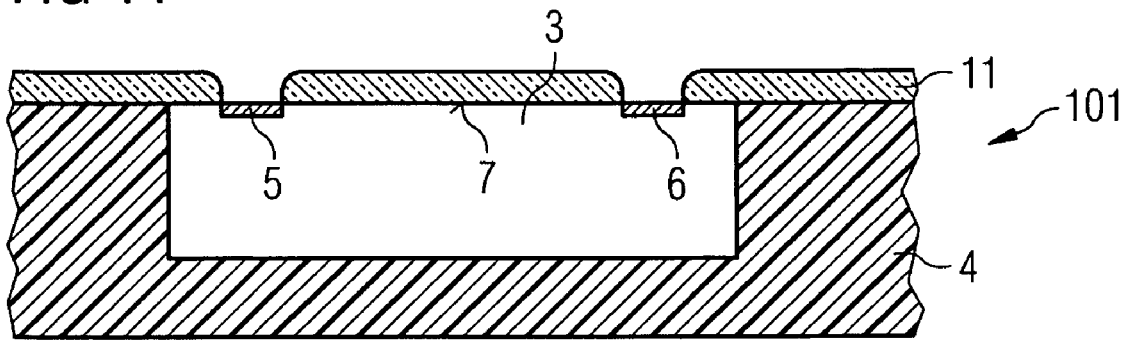
FIGS. 11-18 are schematic illustrations of fabrication processes of producing a semiconductor structure according to one embodiment.

The fabrication process of the semiconductor structure 300 is exemplified by FIGS. 11 to 18. As a starting point, FIG. 11 illustrates the substrate 101 completely covered by the insulating layer 11 except of openings through which the contact pads 5, 6 are accessible. As mentioned above, the layer 11 may not be needed especially on the molded material 4. The first polymer layer 21 is then deposited on the substrate 100. The thickness of the first polymer layer 21 may be between 2 and 20 μm, typically about 5 μm. A standard CVD process or spin coating process may be used. The first polymer layer 21 may be made of a photoresist or of any other etching resist.

Figure 12:
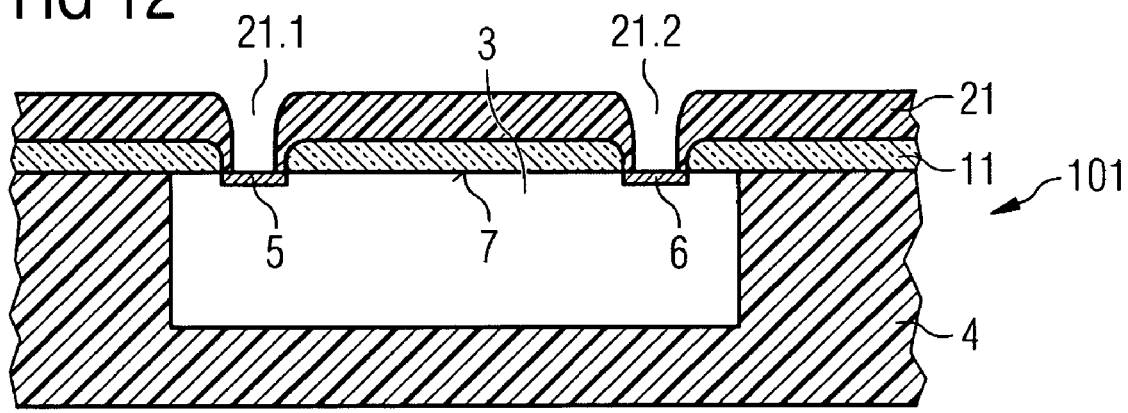
Figure 13:
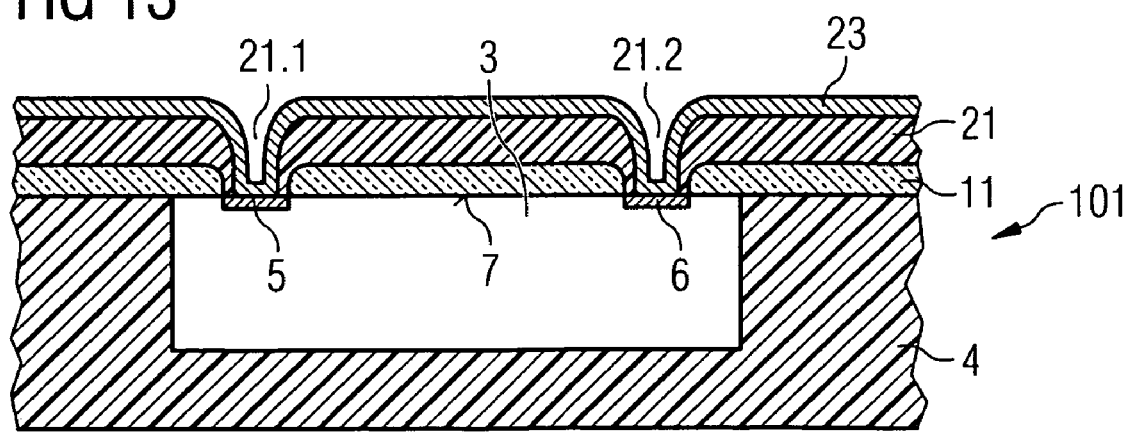
Figure 14:
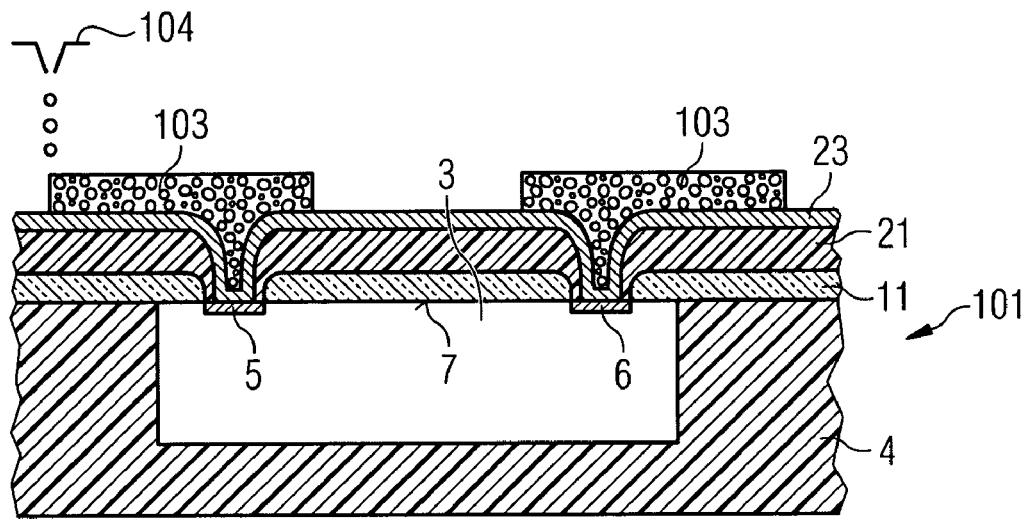

Subsequently, the first polymer layer 21 is structured (FIG. 12). Structuring may be accomplished by photolithographic techniques known in the art. During structuring, through-holes 21.1, 21.2 are generated in the first polymer layer 21. At the bottom of through-holes 21.1 and 21.2, the chip pads 5, 6 (e.g., made of aluminum) are exposed.

In a next process the metal layer 23 is applied onto the first polymer layer 21. In through-holes 21.1 and 21.3 the metal layer 23 makes contact to the chip pads 5 and 6, respectively. Many techniques are available to generate the metal layer 23, inter alia PVD (Physical Vapor Deposition), sputtering or coating with nano inks. Typically, the metal layer 23 covers the whole surface of the substrate 101 and might include an adhesion layer, a barrier layer and/or a bulk and/or seed layer of different metals or metal alloys.

Then, a structured etch resist layer 103 is applied over the metal layer 23 by a jet printing method. Reference is made to the description to FIG. 6. The etch resist structures 103 cover parts of the metal layer 23 which are intended not to be removed.

Figure 15:
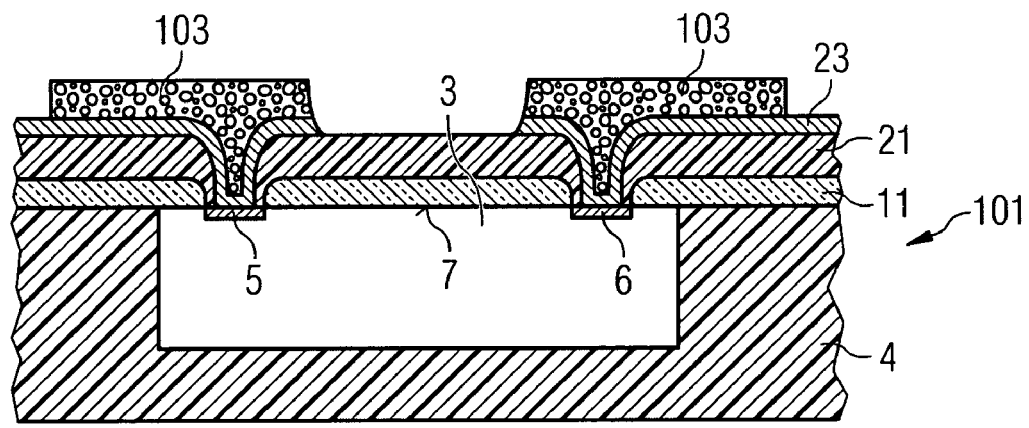

The metal layer 23 is then structured by applying an etchant to remove the uncovered parts thereof (FIG. 15). Reference is made to the description of FIG. 7.

Subsequently, the printed etch resist 103 is removed, see FIG. 16. Then, the second polymer layer 22 is deposited over the structured metal layer 23 (FIG. 17). The second polymer layer 22 may be made of the same material as the first polymer layer 21 and the thickness of the second polymer layer 22 may be in the same range as the thickness of the first polymer layer 21.

The second polymer layer 22 is then structured by e.g., photolithographic techniques to provide for the openings 22.1, 22.2. The external contact elements 25.1, 25.2 are applied (e.g., solder ball attach). Thus, the first external contact element 25.1 is connected via a portion of the structured metal layer 23 to the first chip pad 5 and the second external contact element 25.2 is connected via a portion of the structured metal layer 23 to the second chip pad 6 of the semiconductor chip 3.

In the above description, structuring of the first and second polymer layers 21, 22 is made by photolithographic processes. However, as will be explained further below, these polymer layers 21, 22 may also be generated and directly structured by ink-jet printing. Further, it is to be noted that the method processes illustrated in FIGS. 11 to 18 (except the ball attach) are thin-film processes using techniques such as CVD, PVD, spin coating, galvanic plating, electroless plating, printing, photolithography etc. These processes are part of the backend fabrication process, i.e. are fabrication processes which are applied after the integrated circuits have been finished and possibly tested (so-called frontend processing). It is to be noted that the backend processing described above may still be performed on wafer level, i.e. before the embedded semiconductor chip substrate 101 is separated into single modules.

Figure 19:
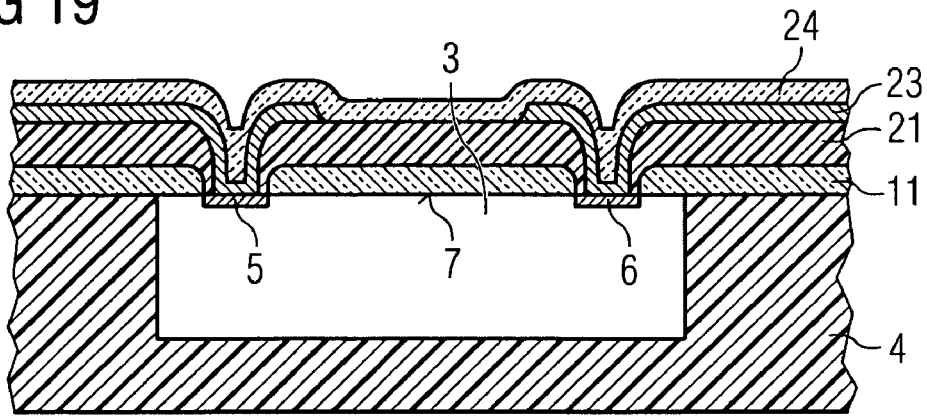
FIGS. 19-21 are schematic illustrations of fabrication processes of producing a semiconductor structure according to one embodiment.
Figure 20:
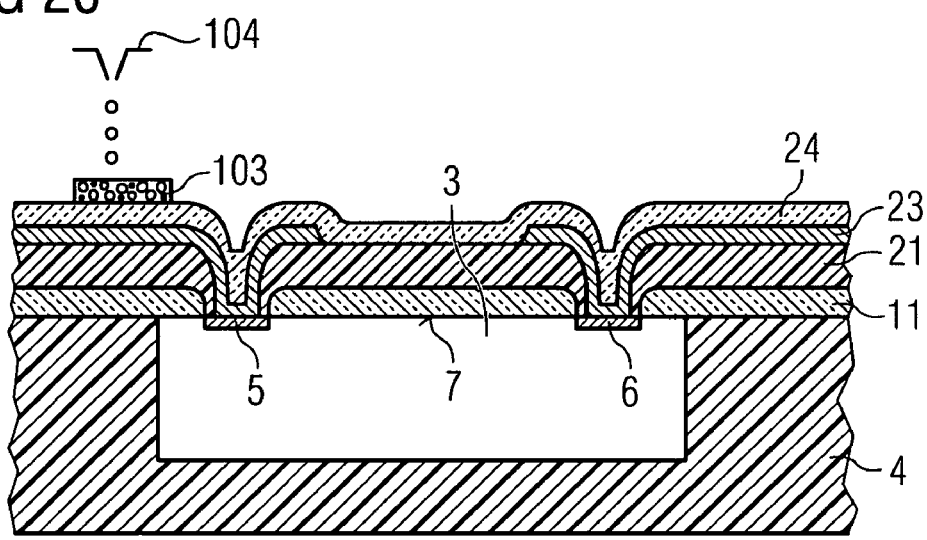
Figure 21:
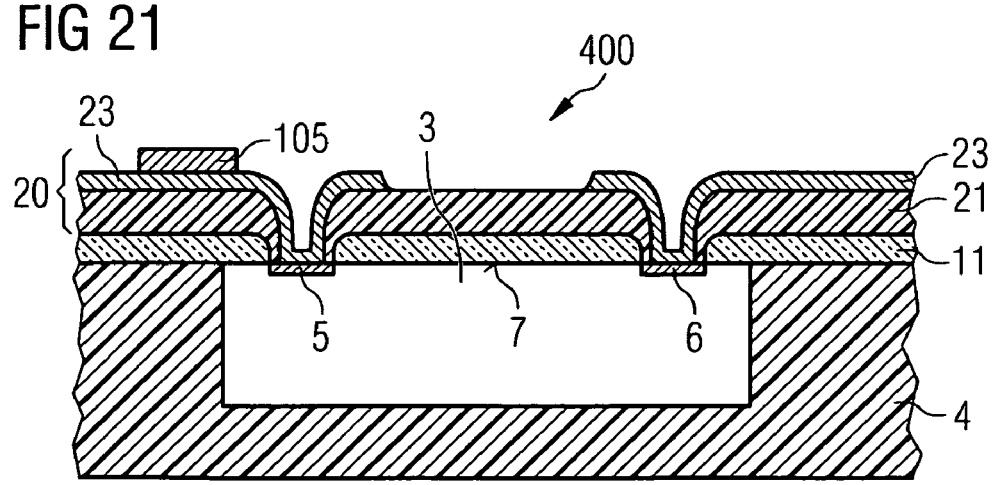

It is possible to embed passives such as e.g., capacitors in the RDL 20. Such semiconductor structure 400 is illustrated in FIGS. 19 to 21. The structure as illustrated in FIG. 16 is coated with a dielectric layer 24. The dielectric layer 24 may cover the whole surface of the structure illustrated in FIG. 19. Then, according to FIG. 20, an etch resist 103 is placed by ink-jet printing over a part of the dielectric layer 24. As illustrated in FIG. 21, the uncovered parts of dielectric layer 24 are removed. The structure 105 formed of the dielectric layer 24 is an image of the structured etch resist 103. This dielectric structure 105 may be used as a dielectric of a capacitor. To this end, the part of the metal layer 23 contacting the chip pad 5 is used as a lower electrode of such embedded capacitor. In subsequent fabrication processes (not illustrated) another dielectric layer is applied over the metal layer 23 and another metal layer is placed in contact to the top of the dielectric structure 105. This other metal layer (not illustrated) constitutes the top electrode of the capacitor. Thus, such capacitor is completely integrated within the RDL 20.

Figure 22:
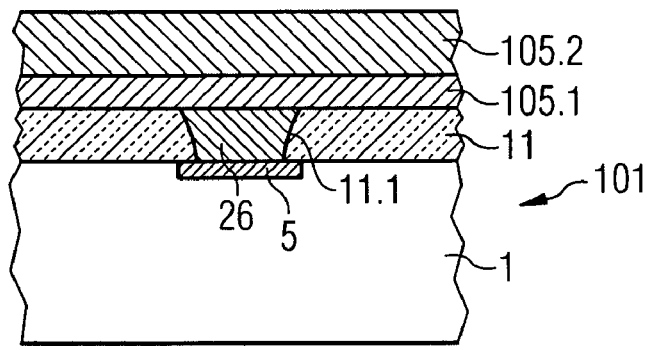
FIGS. 22-26 are schematic illustrations of fabrication processes of producing a semiconductor structure according to one embodiment.

FIGS. 22 to 26 illustrate in more detail how to generate a structured metal layer such as e.g., a conductor track by using jet printing technology. FIG. 22 illustrates a detail of a semiconductor chip 3 embedded in a substrate 101. The process described in the following is a more detailed representation of a method processes outlined in FIGS. 8, 9B and 10. More specifically, FIGS. 22 to 26 illustrate how a metal structure 105 may be generated over a chip pad 5.

As a starting point, a substrate 101 is provided. As depicted, a hard passivation layer 11 may e.g., be applied to one of its main surfaces. The hard passivation layer 1 has an opening 11.1 arranged over the chip pad 5 and filled by a conductive material 26. Referring to the semiconductor structure 500 illustrated in FIG. 26, the conductive structure 105 includes an adhesive and/or barrier layer 105.1, a seed layer 105.2 and an electro-plated metal layer 105.3. Returning to FIG. 22, first the adhesive layer 105.1 is deposited to cover all over the substrate 1. The adhesive layer 105.1 may be made of sputtered TiW and may have a typical thickness of 50 nm. This adhesive layer 105.1 may also act as a diffusion barrier. Then, the seed layer 105.2 is deposited and also covers the whole surface of the substrate 101. The seed layer may be made of sputtered copper and may have a typical thickness of about 150 nm.

Figure 23:
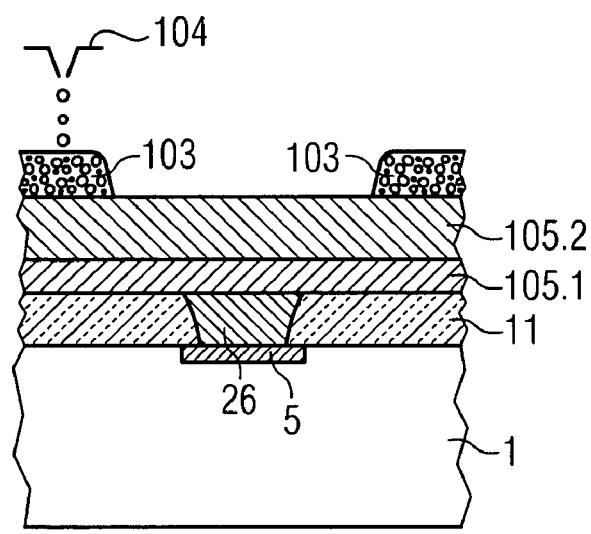
Figure 24:
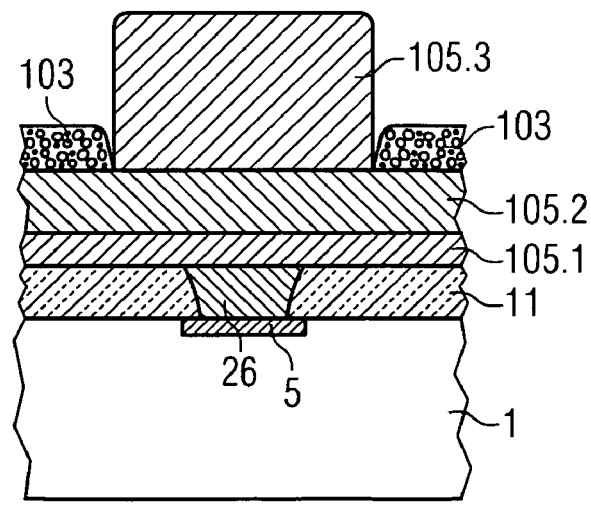
Figure 25:
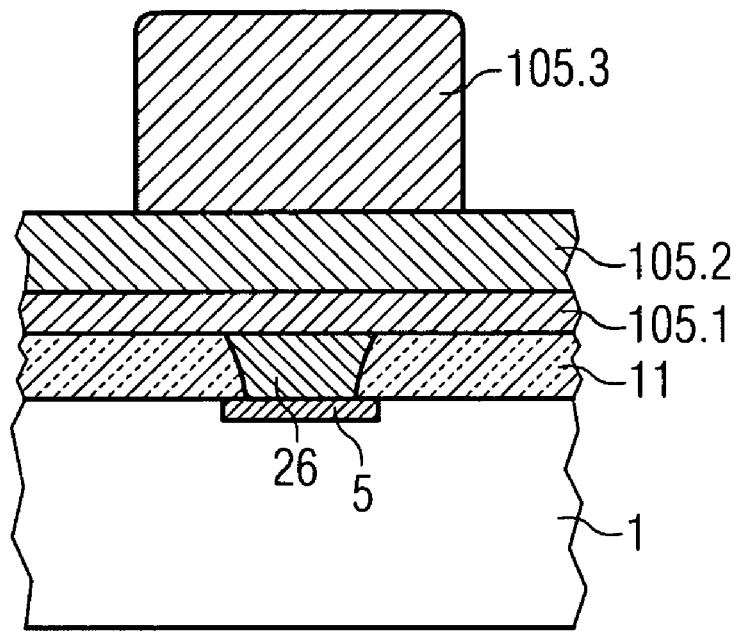

Then, as illustrated in FIG. 23, a structured mask 103 is applied by ink-jet printing to cover such parts of the seed layer 105.2 where no material of electro-plated metal layer 105.3 shall be applied. In other words, parts over the substrate 101, where conductive lines such as conductor tracks or other conductive areas are to be applied, are left uncovered. Then, the seed layer 105.2 covering the entire substrate 101 is used as a cathode in a galvanic deposition process. That way, electro-plated copper 105.3 is applied onto the uncovered parts of the continuous seed layer 105.2 (FIG. 24). Also metal stacks or metal alloys may be plated. Later on the mask 103 is stripped. This results in that the entire substrate surface is now covered by metal, namely the metal (e.g., copper) of the seed layer 105.2 and, where applied, the electro-plated metal (e.g., copper) of the electro-plated metal 105.3. In other words, the conductive lines or regions to be fabricated in the RDL are projecting parts of a substrate metal topography, see FIG. 25.

Figure 26:
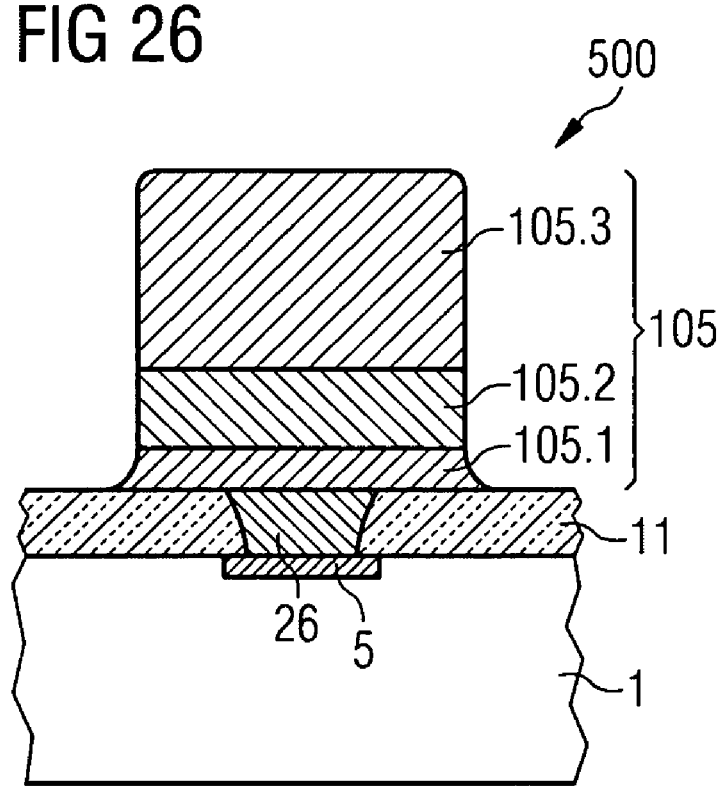

Then, the seed layer 105.2 and the adhesive layer 105.1 are removed by an etching process, see FIG. 26. This etching process may usually remove also an upper part of the electro-plated metal 105.3. At the end of the etching process, the structured metal layer 105 is obtained.

It is to be noted that alternate techniques are also available to produce the structured metal layer 105. For instance, the structured metal layer 105 may be generated by an electroless plating process. In this case, the seed layer 105.2 is typically made of nickel and the electro-plated metal 105.3 (e.g., copper) is electrolessly deposited by virtue of a chemical reaction (i.e. without the use of external electric power).

Figure 27:
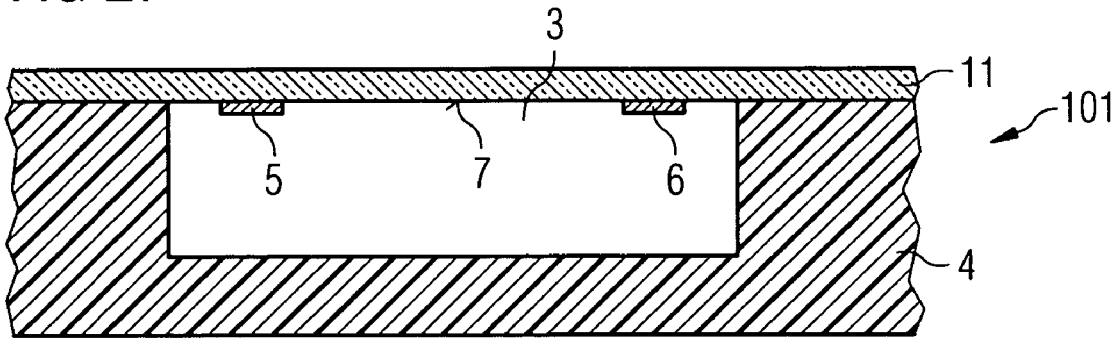
FIGS. 27-29 are schematic illustrations of fabrication processes of producing a semiconductor structure according to one embodiment.
Figure 28:
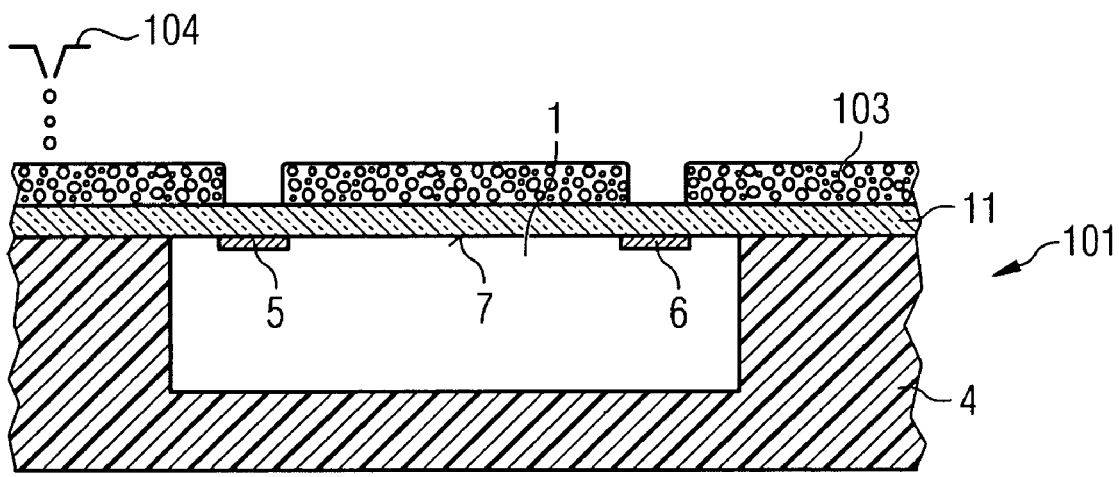
Figure 29:
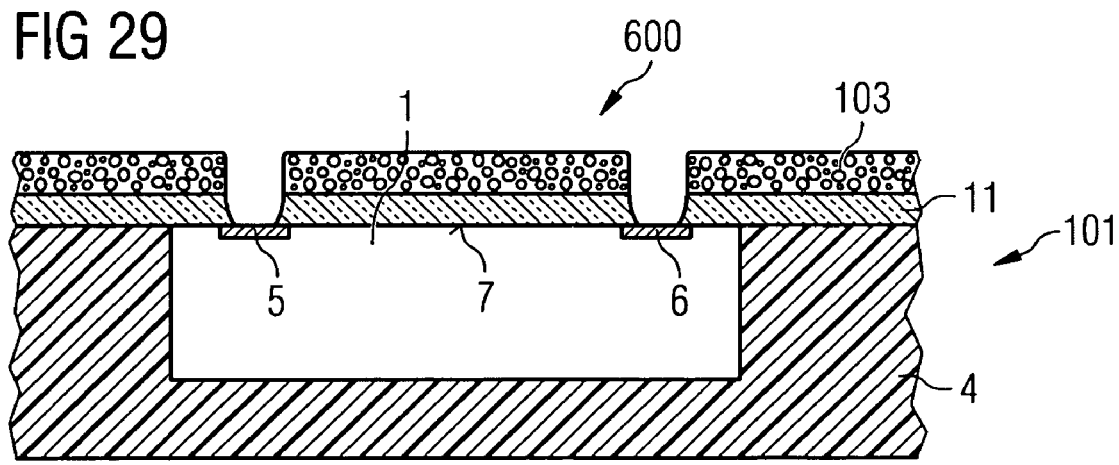

FIGS. 27 to 29 demonstrate a process to structure a hard passivation layer by using an ink-jet printing process. FIG. 27 illustrates substrate 101 coated with an inorganic hard passivation layer 11. Etch resist 103 is ink-jet printed over the parts of the hard passivation layer 11 which are intended not to be removed. Then, an etchant is used to remove the uncovered areas of the hard passivation layer 11. As a result, the chip pads 5, 6 are exposed, see the semiconductor structure 600 illustrated in FIG. 29.

Figure 30:
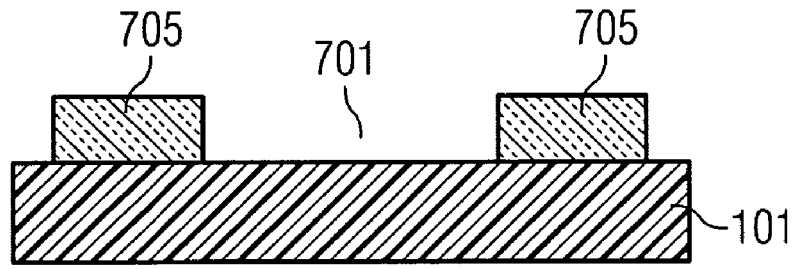
FIGS. 30-32 are schematic illustrations of fabrication processes of producing a semiconductor structure according to one embodiment.
Figure 31:
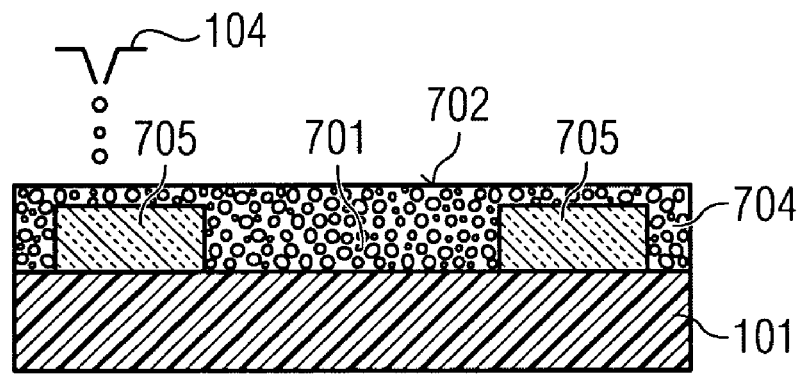
Figure 32:
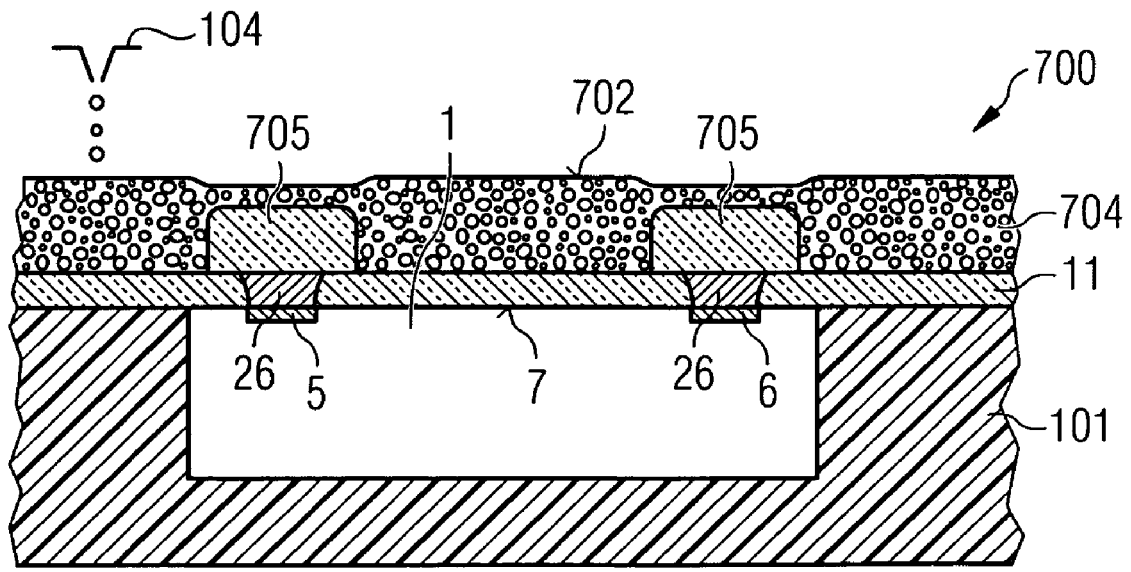

FIGS. 30 to 32 illustrate fabrication processes of producing a semiconductor structure 700. FIG. 30 illustrates an embedded semiconductor chip substrate 101 on which projecting structures 705 are arranged. By way of example, the projecting structures 705 may be structures 105 generated by one of the aforementioned processes. In one embodiment, the projecting structures 705 may be conductive lines 105 as illustrated in FIG. 26. However, the projecting structures 705 may also be made by using another structuring method such as e.g., photo-lithography. Further, the projecting structures 705 may be made of an insulating material such as a polymer or an inorganic dielectric.

According to FIG. 31, recesses 701 defined by the substrate 101 and the projecting structures 705 are filled by a jet printing process. The projecting structures 705 may have a height of e.g., about 3 to 15 μm (corresponding to the depth of the recesses 701). However, they may also be smaller or larger. The filling of the recesses 701 may be accomplished such that the recesses 701 are completely filled and further, a relatively thin layer of ink covers the top of the projecting structures 705. That way, the substrate 101 is protected against environmental attacks by the printed structure 704. Further, the application of the ink material may provide a top surface 702 of the printed structure 704 which is substantially flat and which may be used as a platform for following processes. In one embodiment, the substrate 101 is suited for any kind of planar process to be performed on surface 702, which substantially extends within one plane.

FIG. 32 illustrates one embodiment of the structure illustrated in FIG. 31. Here, the projecting structures 705 are made of metal and are electrically connected to chip pads 5 and 6, respectively.

Leveling of the surface 702 of the printed structure 704 is obtained by controlling the ink throughput of the printing head 104 depending on the layout of the projecting structures 705. More specifically, the amount of ink dispatched per square area may be controlled such that a desired height of the printed structure 704 is obtained over the substrate 101. To this end, a light beam of a curing lamp (not illustrated) may accompany the ink-jet beam and illuminate the target location of the ink beam. Further, the unevenness of the surface 702 is minimized if the material of the projecting structure 705 has a high wettability towards the ink. Heavy topographical profiles might be equalized by additional repeated printing sequences.

Figure 33:
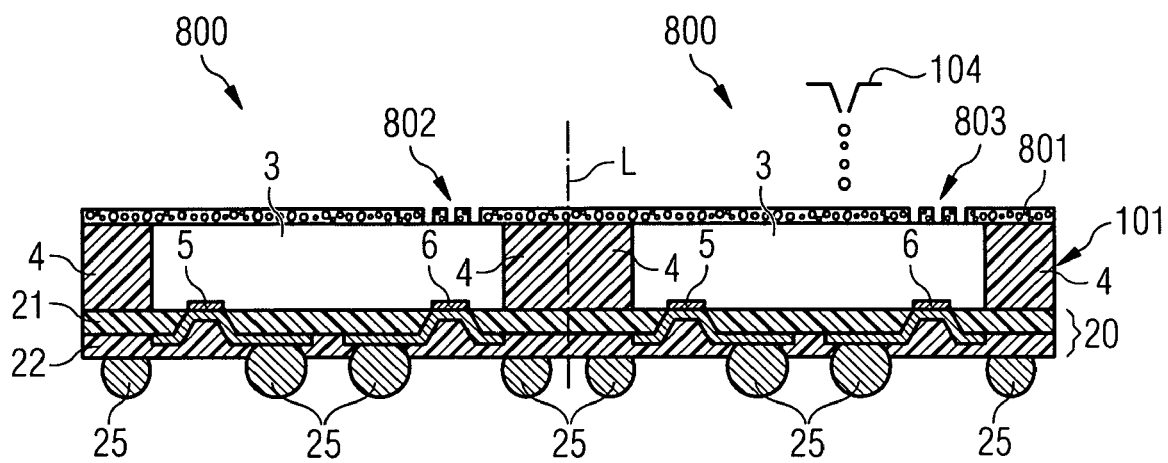
FIG. 33 is a schematic illustration of a fabrication process of producing a semiconductor structure according to one embodiment.

FIG. 33 illustrates another application of an ink-jet method applied to wafer level processing. In the semiconductor 800 an embedded semiconductor chip structure 101, e.g., embedded semiconductor chip structure 2 as illustrated in FIG. 2, is equipped with an RDL 20 as exemplified in FIG. 18. Contact elements such as solder balls 25 are electrically connected to the RDL 20 in order to provide external contact means to mount the corresponding modules onto a mounting platform such as a PCB. Modules may be obtained by separating the embedded semiconductor chip substrate 2 at separation lines L into single modules.

The backside of the embedded semiconductor chip substrate 101 is coated by an ink protection layer 801. The ink protection layer 801 is applied over the whole backside surface of the embedded semiconductor chip substrate 101 by using an ink-jet process. The ink protection layer 801 may be generated before separation of the embedded semiconductor chip substrate 101 into single modules or after the separation of the embedded semiconductor chip module 101 into the modules.

As illustrated at 802, 803, the ink-jet printing process may be controlled such that a specific information pattern is generated within the ink protection layer 801. The information pattern 802, 803 may be implemented by characters, numbers, bar codes, data matrix codes or any other signs. The information pattern 802, 803 is accomplished by "negative writing", i.e. the individual signs are formed by blank areas within the ink protection layer 801 or, if a plurality of ink protection layers 801 are used, typically within the latest layer thereof. This marking technique may be advantageous over laser engraving, which is known to be used in conventional techniques because it does not damage the surface of semiconductor chips 3. The information encoded in the information pattern 802, 803 may refer to one of a chip identification, a module identification or an embedded semiconductor chip substrate identification. Further, other types of information such as test results and so on may be marked on the backside of the embedded semiconductor chip substrate 101.

Not illustrated in FIG. 33, it is possible to apply two layers of ink to the backside of the embedded semiconductor chip substrate 101. The first layer may be applied by a screen printing process, an ink-jet printing process or any other thin-film technique which provides for the application of a continuous layer. The second layer corresponding to the ink protection layer 801 is applied by an ink-jet printing process as explained above. The information pattern 802, 803 is only generated within the upper ink protection layer 801. That way, the first protection layer (not illustrated) is visible through the unfilled information pattern 802, 803. By using first and second protection layers of different color, e.g., yellow and green, the visibility of the information pattern 802, 803 may be enhanced. Further, the provision of the first protection layer (not illustrated) results in that the backside of the semiconductor chip 3 is completely covered and protected against environmental or mechanical attacks.

Figure 34:
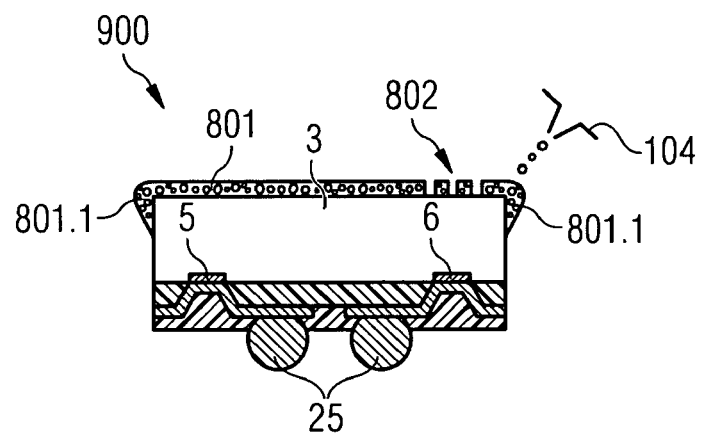
FIG. 34 is a schematic illustration of a fabrication process of producing a semiconductor structure according to one embodiment.

Backside negative ink-jet printing as illustrated in FIG. 33 may also be applied to a conventional semiconductor wafer substrate 9 as illustrated in FIG. 3. In this case, the only difference to the arrangement illustrated in FIG. 33 is that the molded regions 4 are omitted. Again, the ink-jet printing process may be applied before or after dicing the semiconductor wafer 9. FIG. 34 illustrates a method to fabricate a semiconductor structure 900 in which the ink protection layer 801 is applied after dicing. In this case, it is possible to use e.g., a pivotable printing head 104 in order to apply an edge protection 801.1 at the backside edge of the semiconductor chip 3.

Figure 35:
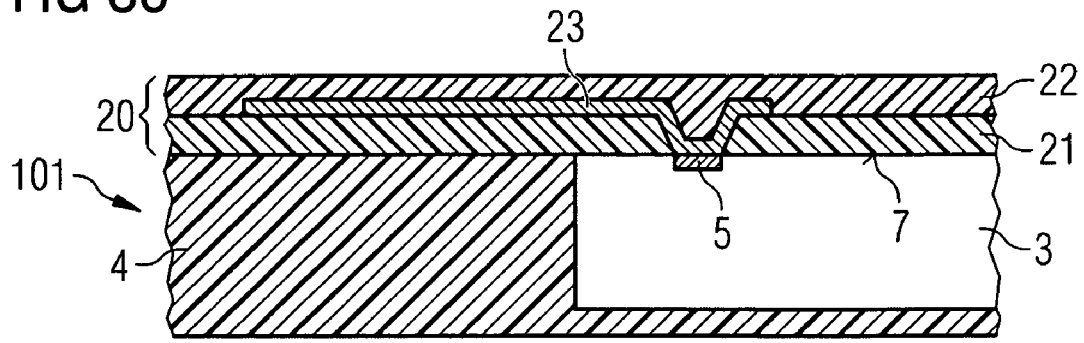
FIGS. 35-40 are schematic illustrations of fabrication processes of producing a semiconductor structure according to one embodiment.
Figure 36:
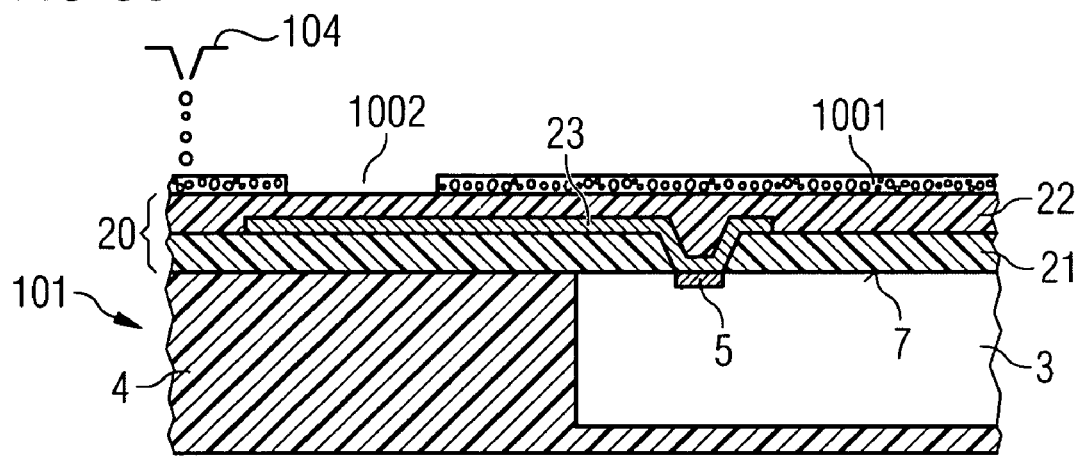

FIGS. 35 to 40 are schematic illustrations of fabrication processes of producing a semiconductor structure 1000. In FIG. 35 a part of an embedded semiconductor chip structure 101, e.g., embedded semiconductor chip structure 2 as illustrated in FIG. 2, is depicted. As explained in connection with the aforementioned embodiments, the embedded semiconductor chip substrate 101 is equipped with an RDL 20 formed by a first polymer layer 21, a second polymer layer 22 and a structured metal layer 23 placed in-between the two polymer layers 21, 22. The second polymer layer 22 is made of a photoresist and intended to serve as a solder stop layer, see FIG. 39. The second polymer layer 22 may be applied by screen printing method or by ink-jet printing. Further, other processes, as mentioned before, are available to apply the second polymer layer 22, which may extend over the whole surface of the embedded semiconductor chip substrate 101.

In a next process, a jet printing process is used to apply a non-transparent or opaque structured layer 1001. The structured layer 1001 is recessed at a portion 1002 overlaying the metal layer 23.

Figure 37:
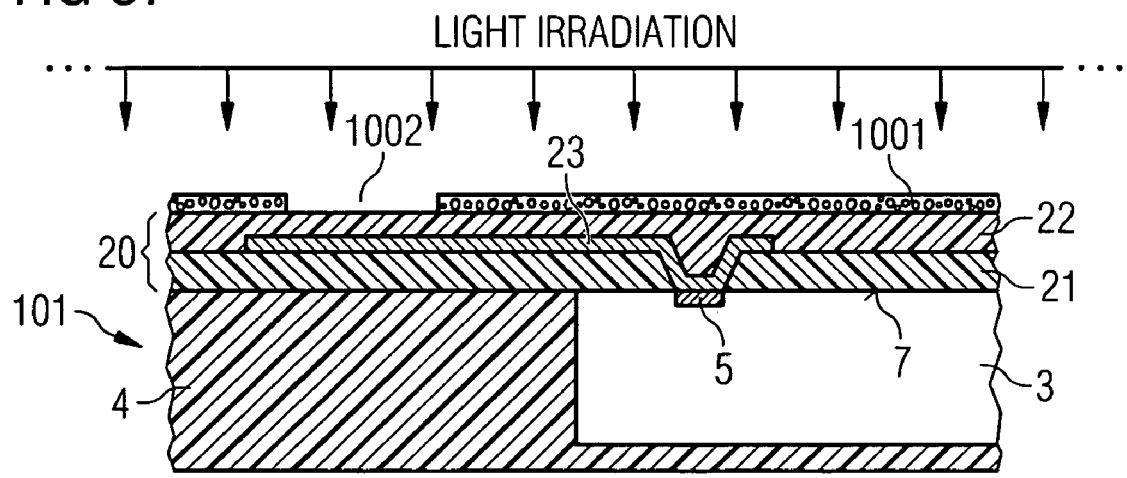

In FIG. 37 the embedded semiconductor chip substrate 101 is irradiated by light, in one embodiment UV light. Light irradiation is applied over the whole surface of the embedded semiconductor chip substrate 101.

Figure 38:
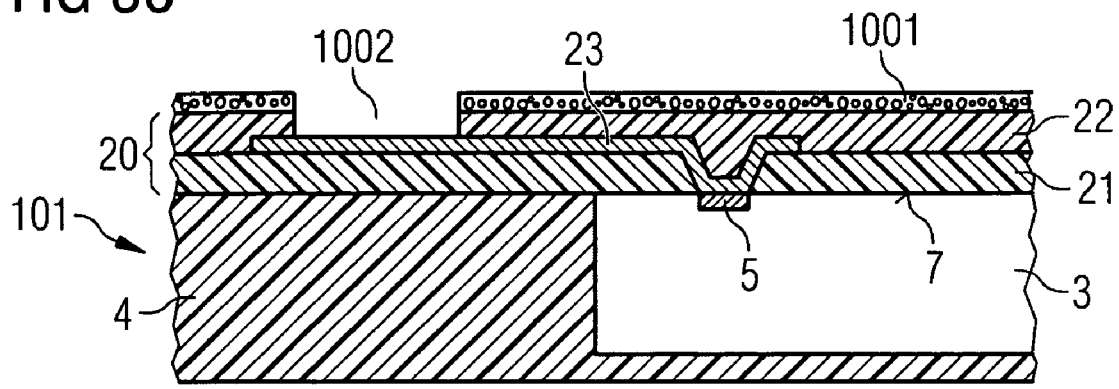

After irradiation, the second polymer layer 22 (photoresist) is developed and removed at a portion 1002 which was not covered by the photo blocking structured layer 1001, see FIG. 38.

Then, a contact element such as e.g., solder ball 25 is attached to the exposed area of the metal layer 23. The structured layer 1001 may remain on the second polymer layer 23 (photoresist) or may be stripped, if necessary.

Figure 39:
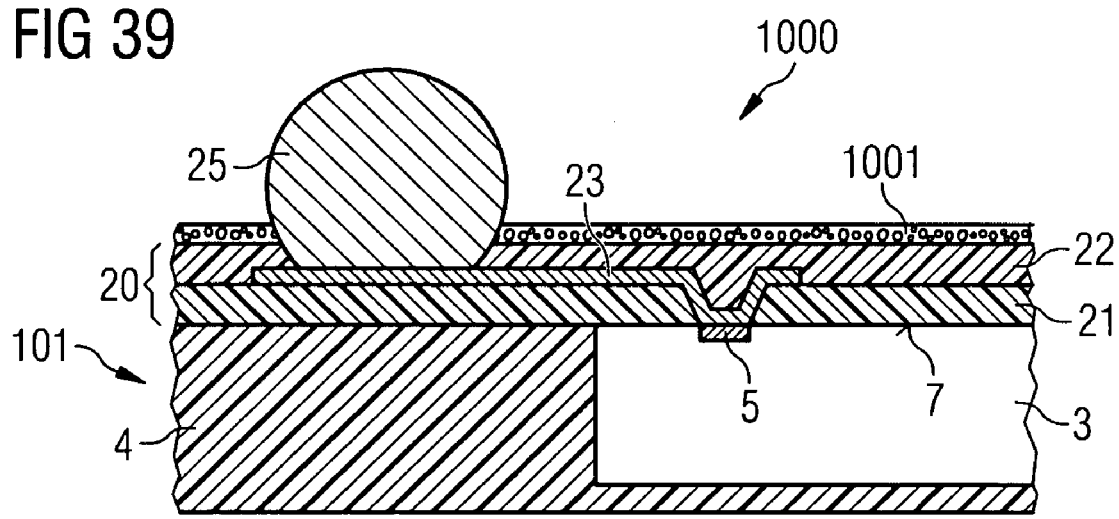
Figure 40:
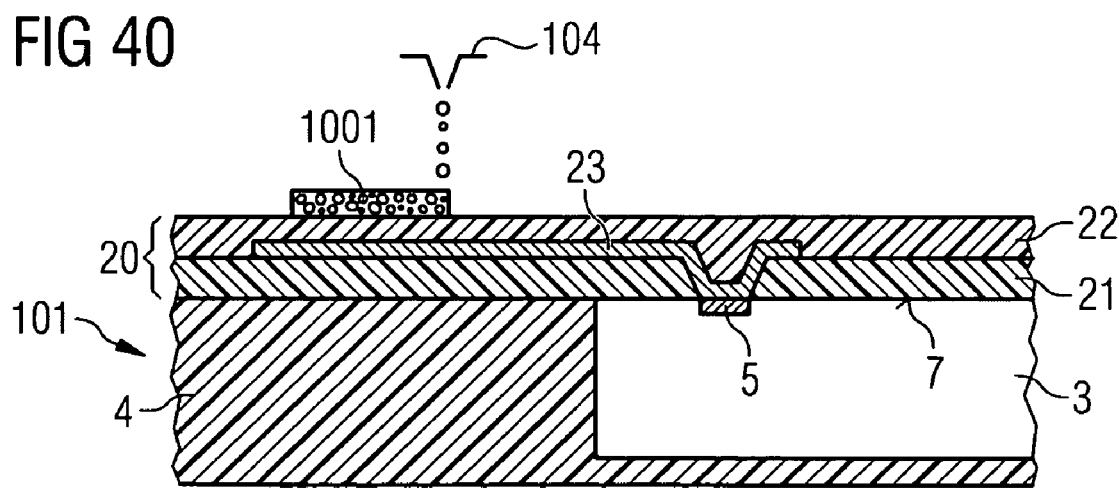

In the process illustrated in FIGS. 35 to 39, a positive photoresist is used for the second polymer layer 22. In one embodiment, a negative photoresist can be employed for the second polymer layer 22. In this case, a structured layer 1001 as illustrated in FIG. 40 is applied on the second polymer layer 22 (photoresist) by an ink-jet printing method. The applied structure corresponds to the shape of the region to be removed in the second polymer layer 22.

In a subsequent process, the embedded semiconductor chip substrate 101 is irradiated by light as illustrated in FIG. 37. Light irradiation is blocked by the structured layer 1001 illustrated in FIG. 40.

Afterwards, the second polymer layer (photoresist) 22 is developed and thereby, the non-irradiated part underlaying the structure layer 1001 is removed. As a result, the same structure as illustrated in FIG. 38 is obtained. Again, solder ball attach is accomplished as illustrated in FIG. 39.

In a further process, the solder stop represented by the second polymer layer 22 may directly be deposited by an ink-jet process in a structured form as illustrated in FIG. 38 on the embedded semiconductor chip substrate 101. In this case, the structured layer 1001 is not necessary and can be omitted. Thus, this technique provides a semiconductor structure as illustrated in FIG. 39, however without structured layer 1001. The jet printed second polymer layer 22 forms part of the RDL 20.

In addition, while a particular feature or aspect of one embodiment has been disclosed with respect to only one of several implementations, such features or aspects may be combined with one or more other features or aspects of the other implementations as may be desired and advantageous for any given or particular application. It is also to be appreciated that features and/or elements depicted herein are illustrated with particular dimensions relative to one another for purpose of simplicity and ease of understanding, and that actual dimensions may differ substantially from those illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor structure, comprising:
    producing a substrate comprising at least two semiconductor chips embedded in a molded body;
    applying a layer to be structured over at least one main surface of the substrate;
    applying a patterned etch resist layer over the layer to be structured using a jet printing process;
    selectively removing the layer to be structured using an etch process to generate a structured layer; and
    keeping the etch resist layer as a permanent protective layer on the structured layer.

2. The method of claim 1, wherein the layer to be structured is a metal layer.

3. The method of claim 1, wherein the layer to be structured is a dielectric hard passivation layer.

4. The method of claim 1, wherein the layer to be structured is a polymer layer.

5. The method of claim 1, wherein the layer to be structured is a capacitor dielectric layer made of a high k dielectric material.

6. The method of claim 1, further comprising:
    applying a dielectric layer over the structured layer by using a jet printing process.

* * * * *